United States Patent [19]

Lee et al.

[11] Patent Number: 5,714,008
[45] Date of Patent: Feb. 3, 1998

[54] MOLECULAR BEAM EPITAXY SOURCE CELL

[75] Inventors: Myung B. Lee, Smithtown, N.Y.; Jari Vanhatalo, Beverly, Mass.

[73] Assignee: Northrop Grumman Corporation, Los Angeles, Calif.

[21] Appl. No.: 639,641

[22] Filed: Apr. 29, 1996

Related U.S. Application Data

[62] Division of Ser. No. 361,961, Dec. 22, 1994, Pat. No. 5,616,180.

[51] Int. Cl.$^6$ ............................................. C23C 16/00
[52] U.S. Cl. ............................ 118/715; 117/108; 118/719; 118/726
[58] Field of Search ............................ 117/200, 201, 117/202, 900; 118/715, 719, 726

[56] References Cited

U.S. PATENT DOCUMENTS

| | | | |
|---|---|---|---|
| 3,839,084 | 10/1974 | Cho et al. | 117/105 |
| 4,181,544 | 1/1980 | Cho | 392/388 |
| 4,239,955 | 12/1980 | Cho | 392/388 |
| 4,518,846 | 5/1985 | Freeouf et al. | 392/388 |
| 4,622,083 | 11/1986 | Shih | 117/108 |
| 4,640,720 | 2/1987 | Foxon | 117/105 |
| 4,646,680 | 3/1987 | Maki | 118/726 |
| 5,041,719 | 8/1991 | Harris et al. | 219/390 |
| 5,080,870 | 1/1992 | Streetman et al. | 118/715 |
| 5,122,393 | 6/1992 | Tuppen et al. | 427/255.2 |
| 5,336,324 | 8/1994 | Stall et al. | 118/719 |
| 5,415,128 | 5/1995 | Kao et al. | 117/98 |
| 5,433,791 | 7/1995 | Brewer et al. | 118/724 |
| 5,540,780 | 7/1996 | Haas et al. | 118/724 |

OTHER PUBLICATIONS

Anderson et al., *Materials Science 4th Ed.*, Chapman & Hall, New York, 1990, pp. 464–466.

*Primary Examiner*—Felisa Garrett
*Attorney, Agent, or Firm*—Terry J. Anderson; Karl J. Hoch, Jr.

[57] ABSTRACT

Apparati and methods for varying the flux of a molecular beam emanating from an effusion cell are disclosed. The apparatus includes a means for controllably adjusting the angular distribution of a molecular field effusing from a source material within the effusion cell, therein adjusting the flux of the beam. The method herein disclosed, with respect to the related apparati, including the step of selectively altering the angular distribution of an effusing molecular field, produced by a heated source material, which comprises the molecular beam, thereby varying the flux of the beam.

9 Claims, 5 Drawing Sheets

MOLECULAR BEAM EPITAXY SOURCE CELL

This is a divisional of application Ser. No. 08/361,961, filed on Dec. 22, 1994, now U.S. Pat. No. 5,616,180.

BACKGROUND OF THE INVENTION

1. Field of the Invention

The present invention relates to apparati and methods for controlling constituent mass densities within molecular beams, and more particularly to apparati and methods for rapidly varying the flux rate of epitaxial materials from effusion cells during the fabrication of semiconductor devices.

2. Description of Prior Art

Molecular beam epitaxy techniques which permit growing epitaxial layers have been described, and are well known in the art. In a typical molecular beam epitaxy (MBE) system, two or more source materials (generally a semiconductor material and at least one dopant material) are separately heated in effusion cells, thereby elevating their vapor pressures, to generate individual beams consisting of molecules (or atoms) of these materials. The individual beams of molecules then travel under molecular flow conditions toward the surface of a heated substrate where they react to deposit layers of predetermined composition on the substrate surface. The term "molecular flow" is herein used to refer to such flow conditions in which individual molecules move without undergoing direction altering collisions. Such conditions are most practically maintained in an evacuated environment, thus MBE is generally carried out in vacuum chambers.

Although widely used, the molecular beam epitaxy techniques have many inherent deficiencies which plaque fabrication processes and limit production of compositionally graded structures. Compositionally graded structures are those in which the proportion of a given element or molecule varies with respect to the semiconductor matrix over the thickness of the structure. The production of such structures requires the capacity to vary the flux of a given molecular beam in a predetermined manner. In conventional MBE systems, flux rates of a given molecular (or atomic) species are determined by the temperatures, and associated vapor pressures, of the corresponding source materials in their effusion cells. In such conventional MBE systems, as described and illustrated in J. C. Anderson, et al., Materials Science 4 th Ed., Chapman & Hall, N.Y., 1990, p. 464–6, selectively interposeable shuttering elements are positioned between beam sources and target substrates which, upon actuation into or out of the path of the molecular flow, affect the initiation or termination of epitaxial growth.

The fabrication of compositionally graded structures, as described above, requires a more graduated variation in the beam flux than may be provided by the conventional shuttering elements described in the prior art. While the obvious extension of the shuttering technique, which comprises partially inserting a shuttering element into the path of the molecular flow, would reduce the total flux of material, the resultant partial beam would not be uniform. This is so even when the effects of angular dispersion and spatial molecular averaging of the beam are taken into consideration. Nonuniformity in molecular beams of the sort described above cause lateral variation of molecular composition, not the depth variation which is desired.

Several techniques have been disclosed in the art which relates to methods and mechanisms for controllably varying beam fluxes. First is the method of adjusting the temperature, and thereby the vapor pressure, of the individual effusion cell. The levels of control, uniformity, and reproducibility of the beams and epitaxial layers generated by using this technique are limited. Significant time lags in adjusting the temperature of the source elements contribute to the uniformity problems as well as to a dramatic slowing of the production process. During temperature adjustment periods, the flow of source material must be interrupted by interposing shutter elements. During these interrupted periods of temperature adjustment, however, effusion from the source is not terminated. As a result of this, and because the shutter elements do not make a physical seal, a deposition of leaked material continues at an unregulated rate.

The second of the techniques for controllably varying beam fluxes includes the use of expensive needle valves, referred to, in combination with the effusion cells, as valved cracker cells. For example, U.S. Pat. No. 5,080,870 discloses an MBE system including a valve which controls molecular flux. In U.S. Pat. 5,080,870, and other valved cracker cell MBE systems, source material within an effusion cell is maintained at a constant temperature, thereby sustaining a constant vapor pressure within the cell. Opening the needle valve permits the comparatively higher pressure vapor within the cell to escape at a specific flux into the evacuated main MBE chamber. The resultant molecular beam is subsequently directed to a substrate. The extent to which the valve is opened determines the molecular flux of the beam.

Unlike conventional effusion cells, which produce beams of particles having an average energy directly proportional to the temperature of the source material, the energy and speed of the beam produced by a valved cracker cell is, in large part, determined by the difference in pressure across the valve. Forced expansion of the heated vapor through a valve causes it to cool. Valved cracker cells are, therefore, reasonably successful for use with materials which have relatively low boiling points. Arsenic is one such element, however, the majority of important materials (i.e. Ga, Al, In, Sb, Cd, Zn, Se, and Te) have higher boiling points. If these materials are used as sources within valved cracker cells, expansion of the heated vapor through the needle valves tends to cause condensation of the material within the valve. Over a short period of operation, the condensing vapor narrows the effective throat of the valve, thereby altering its performance. The build up of condensed material, in fact, may eventually clog the valve completely. These difficulties, which reduce the ability to effectively regulate of the flux of the beam, render valved cracker cells unsuitable for use in many MBE operations in the fabrication of advanced photonic and electronic devices with compositionally graded regions.

It is, therefore, an object of the present invention to provide a mechanism for use in combination with an effusion cell which affects rapid and controlled variation of the flux within a molecular beam which does not require adjustment of the temperature of the source material.

It is still another object of the present invention to provide a mechanism for rapidly varying the flux from an effusion cell which permits the use of a wide variety of important source materials.

It is still another object of the present invention to provide a mechanism for rapidly varying the flux of a molecular beam which does not use a valve and, therefore, does not become clogged by a condensing source vapor.

It is still another object of the present invention to provide a rapid flux varying effusion cell assembly which permits faster and less expensive MBE fabrication of compositionally graded devices.

Other objects and advantages of the invention will be more fully apparent from the ensuing disclosure and appended claims.

SUMMARY OF THE INVENTION

The foregoing objects are achieved by providing within an effusion cell, a means for controllably adjusting the angular distribution of a molecular field of vapor effusing from a source material within the effusion cell. In one aspect of the present invention the means is a translatable orifice mounted within an effusion cell; the position of the orifice being selectively and motively translatable within the effusion cell for the purpose of adjusting the distance between the orifice and the source, thereby effecting a change in the flux of source vapor effusing from the cell.

In one such aspect, the traveling orifice of the present invention is defined by a hollow frustoconical section having a open base (the narrow end of the section) and an open top (the wider end of the section). The section is slideably mounted within a crucible in which a source material is also disposed. When the source is heated within the crucible at a position between the base of the crucible and the base of the motive frusto-conical section, and the assembly is mounted within a sufficiently evacuated chamber, a molecular beam emanates from the source, passes through the frusto-conical section, and is directed therefrom to a suitable substrate to produce an epitaxial layer.

Given the conventional angular distribution of vapor effusing from a cell, flux control is established by translating the orifice (translating the frustoconical section) to selected positions which adjust the distance between the source material at the base of the crucible and the orifice. An orifice which is positioned closer to the heated source allows a greater number of molecules to pass through. An increase in the distance between the orifice and the source decreases the number of molecules which may traverse the orifice and impinge upon the substrate.

In another such aspect, the traveling orifice of the present invention comprises a nozzle-like open throat which is translatably mounted within an effusion crucible, mounted therein to permit repositioning of the throat with respect to a heated and effusing source disposed therein.

In a different aspect, the means for controllably varying the flux are achieved by a selectively widenable throat mounted in an effusion crucible, which throat is fixably positioned with respect to a source disposed therein. A selectively widenable throat according to such an aspect of the present invention may comprise a plurality of interleaving curvilinear members forming a frustoconical section. The distal ends of the interleaving members, remote from the effusing source material are fixedly hinged to the inner side wall of the crucible. The ends of the interleaving members which are proximally disposed to the source material form a variable area orifice; the area of which may be enlarged or reduced by appropriate rotation of the interleaving members about their hinge points.

DETAILED DESCRIPTION OF THE PREFERRED EMBODIMENT

While the present invention is described more fully hereinafter with reference to the accompanying drawings, in connection with which particular embodiments are illustrated, it is to be understood that persons skilled in the art may modify the invention herein described from the specific forms and structures illustrated, while still achieving the purpose, function and result of this invention. Accordingly, the descriptions which follow are to be understood as illustrative and exemplary of specific structures, aspects, and features within the broad scope of the present invention and not to be construed as limiting of the broad scope of the present invention.

The present invention, in its various aspects and embodiments comprises a means and method for varying the flux of a molecular beam emanating from an effusion cell including an apparatus which adjusts the angular distribution of a molecular field effusing from a source material within an effusion cell. In one embodiment, the present invention features a translatable orifice.

Figure 1:
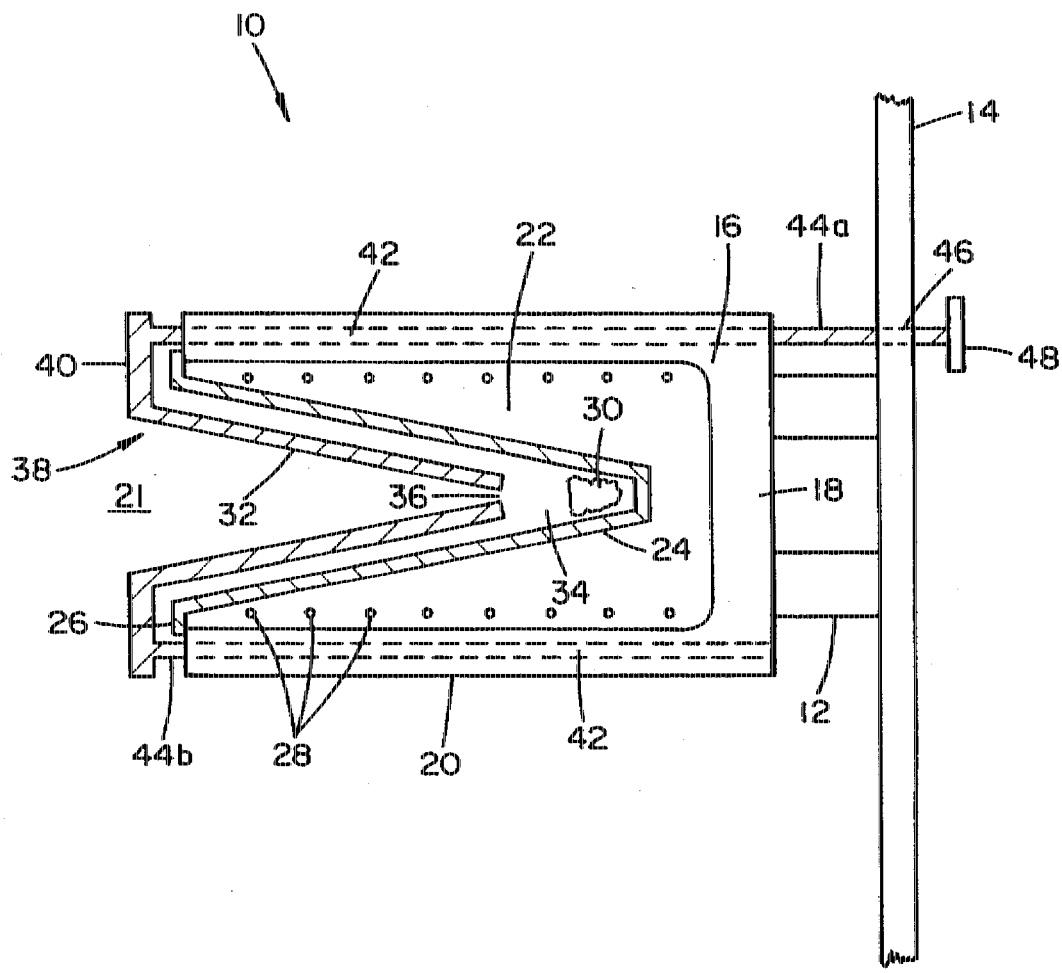
FIG. 1 is a cross-sectional view illustrating one aspect of the present invention.

Referring now to FIG. 1, a rapid varying molecular flux effusion cell is illustrated in a cross-sectional view. The effusion cell assembly 10 is securably mounted on mounting struts 12 within an ultra high vacuum chamber of an MBE apparatus (not shown). In a preferred embodiment, the effusion cell assembly 10 is mounted on a flange element 14 which forms a removable portion of the wall of the vacuum chamber. Such an embodiment permits easy removal, substitution, and replacement of source elements.

The effusion cell assembly includes an outerbody housing 16, of a general cylindrical shape, having a enclosed base 18 and a solid side wall 20. The outerbody housing 16 of one preferred embodiment is constructed of tantalum. It is understood that other structural materials which are stable at high temperatures and have suitably low vapor pressures (required in order to avoid contamination of the epitaxial layers being grown within the chamber) may be used in the alternative.

The outerbody housing 16 defines a region 22 therein. Within region 22 is positioned an inner crucible element 24. The crucible element 24, being frusto-conical in shape, has a maximum outer diameter at its open end which is less than the inner diameter of the outerbody housing. At the open end of the crucible element 24 is an annular lip 26 which extends radially outward at a position adjacent to the side wall 20 of the outerbody housing 16 at its open end. The longitudinal axis of the crucible element is generally coaxial with the outerbody housing 16. In a preferred embodiment, the crucible element 24 is constructed of pyrolytic boron nitride (PBN). The relevant requirement for the material of which the crucible element 24 is manufactured is that it be compatible (low reactivity) with respect to the source materials which are to be heated within the crucible.

A heating coil having windings 28 is positioned between the inner surface of the outerbody housing 16 and the outer surface of the crucible element 24, along the length of the generally cylindrical inner surface of the housing side wall 20. The heating coils 24 are used to heat the crucible and a source material 30 disposed therein, thus raising the vapor pressure of the source within the crucible above the low pressure of the vacuum chamber, therein causing the source to effuse, generating a generally expanding molecular field of vapor.

A translatable hollow frusto-conical section 32, having a cone angle and wide end diameter equal to those of the crucible, is coaxially positioned within the crucible 24. The axial length of the section 32 is less than the length of the crucible; a region 34, therefore, existing between the inner end of the section 32 and the base of the crucible element 24 in which the source material 30 is heated. The narrow end of the section 32 forms an orifice 36 through which, when the source material is effusing, a portion of the expanding molecular field passes and escapes from the crucible, therein forming a beam.

The wide end 38 of frusto-conical section 32 is attached to an annular ring support 40 which extends radially from the wide end of the section 32 beyond the outer diameter of the outerbody housing 16. A pair of diametrically remote, longitudinally extending, bore holes 42 are disposed through the cylindrical side wall 20 of the outerbody housing 16. A pair of support rods 44a and 44b having a diameter smaller than the bore holes 42, are connected to the annular ring 40, and are translatably disposed within the bore holes 42 in such a manner that the section 32 forming the orifice 36 may travel forward and backward along the axial line of the assembly 10. Such repositioning may be automatically carried out within the chamber by motively coupling a motor (not shown) to at least one of the support rods 44a,44b. Such a motor could be controlled by an operator external to the high vacuum chamber.

In the illustrated embodiment one of the support rods 44a is extended through a vacuum sealing port 46 and terminates at a handle 48 therein permitting manual repositioning of the traveling section 32 and therein the orifice 36. The length of the handle 48 from the wall 14 is such that it limits the translating distance which the section 32 may travel out from the housing 16. This effective mechanical stop serves as a block to prevent the section 32 from becoming dislodged during extreme repositioning. It is understood that in specific embodiments which include internally disposed motive elements, as described above, other means may be employed which serve an equivalent function to set the stroke length of the element 50 so that it does not exceed the depth of the outerbody housing 16.

Figure 2:
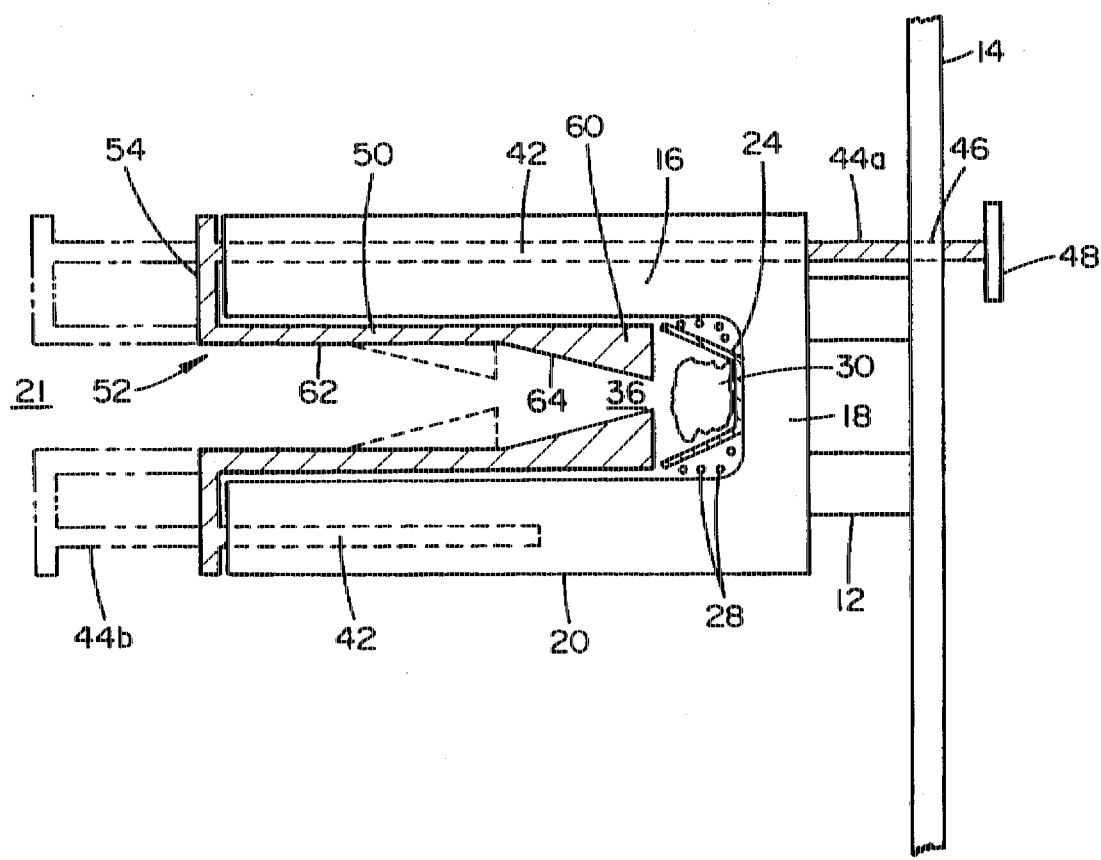
FIG. 2 is a cross-sectional view which illustrates another aspect of the present invention.

With the novel assembly 10, the flux of a molecular beam emanating from an effusion cell containing source material 30, heated to a constant high temperature, can be controllably varied by adjusting the distance between the orifice 36 and the source. Given the conventional angular distribution of vapor effusing from a source, positioning the orifice 36 close to the source will allow a larger angle of that distribution, and therein a greater number of gas molecules, to escape in the emanating beam. Positioning the orifice 36 farther away from the source will, in turn, reduce the number of effusing molecules emitted in the molecular Referring now to FIG. 2, another aspect of the present invention is illustrated in a cross-sectional view. Similar elements shown in FIGS. 1 and 2 are identified with similar numerals. This alternate embodiment of the invention, like the embodiment described above, is securably mounted on mounting struts 12 within an ultra high vacuum chamber of an MBE apparatus (not shown). The effusion cell assembly 10 may be mounted on a flange element 14 which forms a removable portion of the wall of the vacuum chamber.

As described above, this assembly includes an outerbody housing 16, of a general cylindrical shape, having a enclosed base 18 and a solid side wall 20. Fixably positioned at the base of the outerbody housing 16 is an inner crucible element 24. A source material 30 may be positioned within the crucible element 24, which is frusto-conical in shape.

A heating coil having windings 28 is positioned between the inner surface at the base of the outerbody housing 16 and the outer surface of the crucible element 24. The heating coils 28 are used to heat the crucible and the source material 30 disposed therein, thus raising the vapor pressure of the source causing it to effuse, generating a molecular field of vapor, from which a molecular beam may be isolated.

Mounted coaxially within the outerbody housing 16 is a translatable cylindrical element 50. The outer end 52 of the element 50 is connected to an annular ring 54 and support rod 44a,44b assembly which is similar to that of the first embodiment. The total length of the element 50 is less than the depth of the housing 16, so as to position the inner end 60 of the element 50 at the opening 21 of the crucible at the extreme insertion of the element. The extreme inner extent of the stroke of the element 50, corresponds to the position at which annular ring 54 contacts the end portion of the outerbody housing.

With respect to the support rod 44a, of the present embodiment, which extends beyond the vacuum chamber wall 14, as in the embodiment shown in FIG. 1, the length of the handle 48 from the wall 14 is such that it serves as an effective mechanical stop or block to prevent the element 50 from becoming dislodged during extreme repositioning. Again, it is understood that in specific embodiments which include internally disposed motive elements for translating element 50, other means may be employed which serve an equivalent function to set the stroke length of the element 50 so that it does not exceed the depth of the outerbody housing 16.

The cylindrical element 50 has an outer diameter less than the inner diameter of the outerbody housing, therein limiting the friction forces opposing free adjustment of the longitudinal position of the element with respect to the crucible.

The interior surface of the traveling cylindrical element 50 includes two geometrically distinguishable portions, an upper portion 62, and a lower portion 64. The upper portion 62 defines a regular tubular shape, having a constant diameter. The lower portion 64, having a nozzle-like, frusto-conical section shape, narrows from an inner diameter equal to that of the upper portion 62 to a reduced diameter, therein defining an orifice 36.

Repositioning the entire element 50 so that orifice 36 is close to the effusing source provides a larger angle through which the vapor may emanate. Moving the element 50, and therein the orifice 36, comparably farther from the source 30, as shown by the phantom lines in FIG. 2, which lines correspond to a translation of the element, reduces the angular distribution of the total effusing material which may pass. The constant area of the upper portion 62, through which the emanating molecular beam passes, ensures that the beam area is relatively constant, and independent of the distance from the orifice to the source (and therein independent of the flux in the beam).

Figure 3:
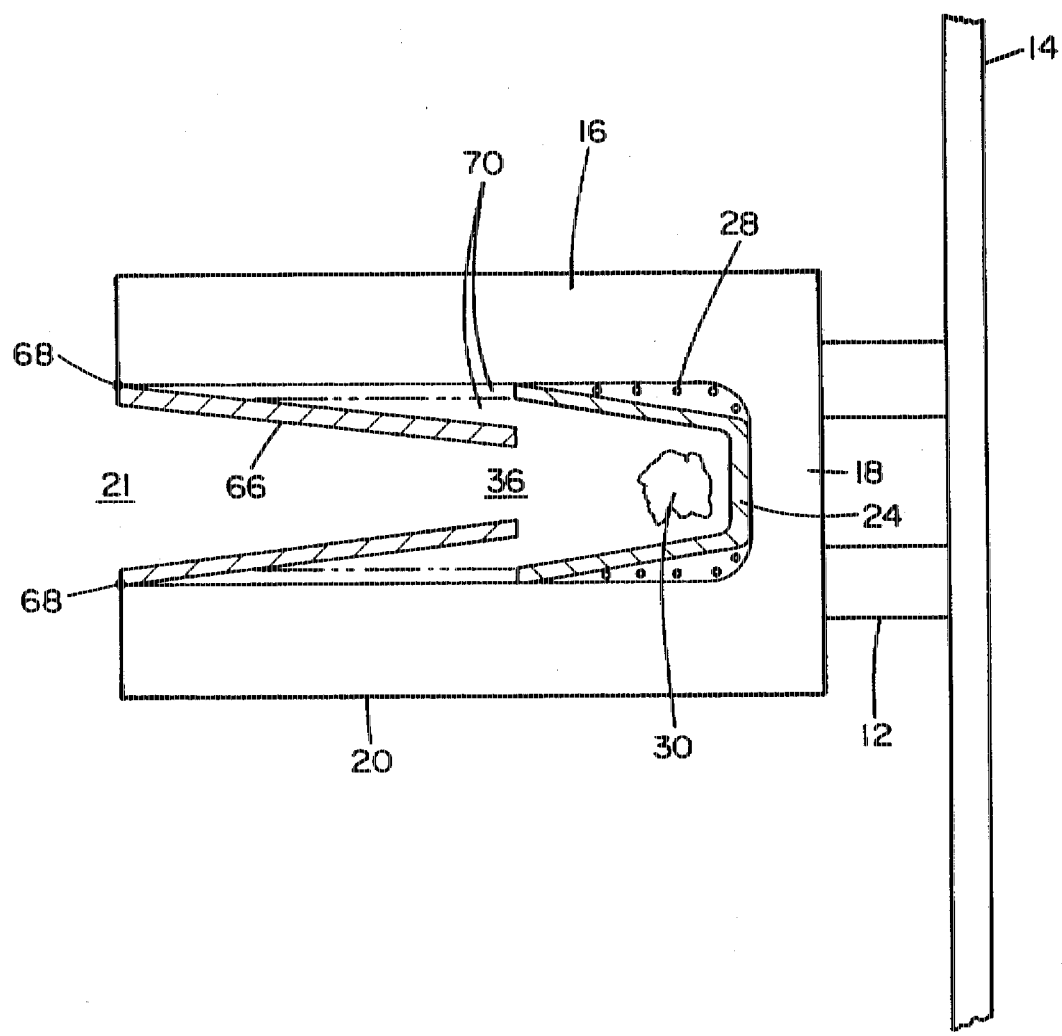
FIG. 3 is a cross-sectional view illustrating still another aspect of the present invention.

Referring now to FIG. 3, a different aspect of the present invention, including a further alternative apparatus for altering the distribution of an effusing molecular field which comprises the molecular beam, is shown in a cross-sectional view. In such an embodiment, the means for controlling the distribution of the emanating molecular field comprises an orifice having a selectively adjustable opening area. FIG. 3 shows an outerbody housing 16 which is secured to a wall 14 of a ultra high vacuum molecular beam epitaxy chamber by mounting struts 12. The outerbody housing 16, includes a base 18, generally cylindrical side walls 20, and an open end 21, and contains a crucible 24 fixedly mounted to the inner surface of the base 18 of the housing. Heating coils 28 are positioned between the inner surface of the outerbody housing 16 and the outer surface of the crucible 24; the coils 28 being positioned to heat a source material 30 disposed within the crucible, therein producing a molecular field of vapor.

A cylindrical assembly of interleaved curvilinear members 66 is fixedly hinged, by hinges 68, to the outerbody housing 16 at the inner surface of the side wall 20 at the open end 21. The interleaved curvilinear members 66 form a cylindrical sheath within the outerbody housing 16, extending into the housing and terminating above the crucible 24. The area defined by the circular cross-section of the interleaved members 66 at the open end of the outerbody housing 16 remains constant because the members 66 are radially fixed by the hinges 68. The ends 70 of the interleaved members 66, which are closest to the source, and which are interleaveably coupled, slide relative to one another, permitting the circular cross-section defined by those ends 70 to be varied. The circular cross-section defined by the ends 70 of the members 66, therefore, defines an orifice 36 having a selectively widenable diameter.

Selective widening or narrowing of the orifice 36, which may be achieved by radially drawing out or compressing the interleaved members 66, alters the angular distribution of the field of effusing source materials which may pass through the orifice to form a molecular beam. Means for radially drawing out or compressing the interleaved members 66 is not shown. Suitable means include coupling the members 66 to an actuatable motor and a series of shafts which apply a radial force to a suitable number of members, causing the interleaved members 66 to draw together, therein narrowing the orifice 36. It is understood that a variety of alternative means maybe employed which serve the same function without distinguishing themselves from the broad scope of the present invention.

Figure 4:
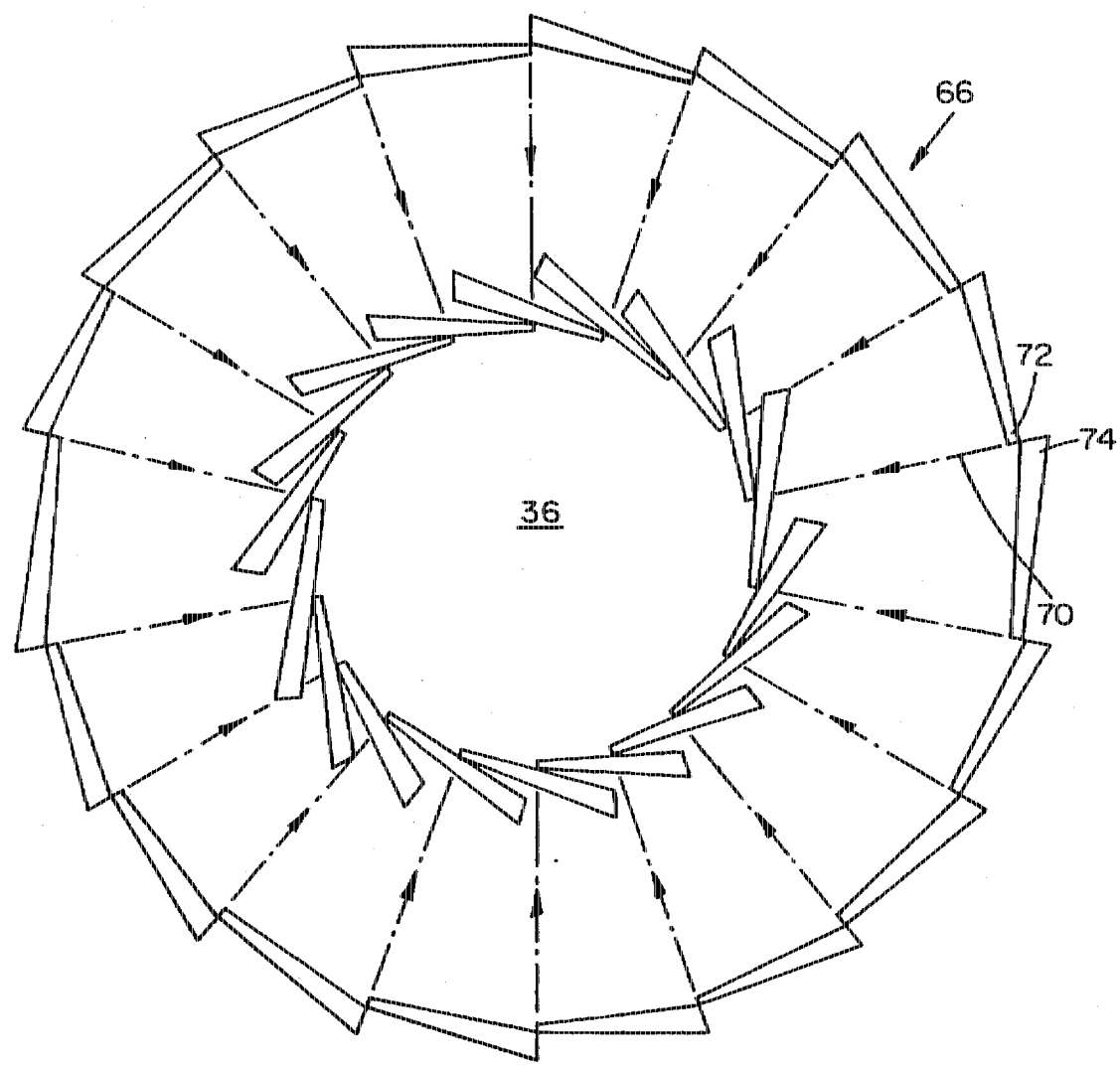
FIG. 4 is an axial view of a variable area orifice according to one aspect of the present invention.

Referring now to FIG. 4, an orifice having interleaving curvilinear sections 66 according to one aspect of the present invention is shown in an axial view. Phantom lines 70 illustrate the direction of motion of the trailing edges 72 of the members 66. Leading edges 74 of the members are understood to slide relative to the trailing edges 72 to which they are adjacent, therein permitting the area of the orifice to be adjusted.

Figure 5:
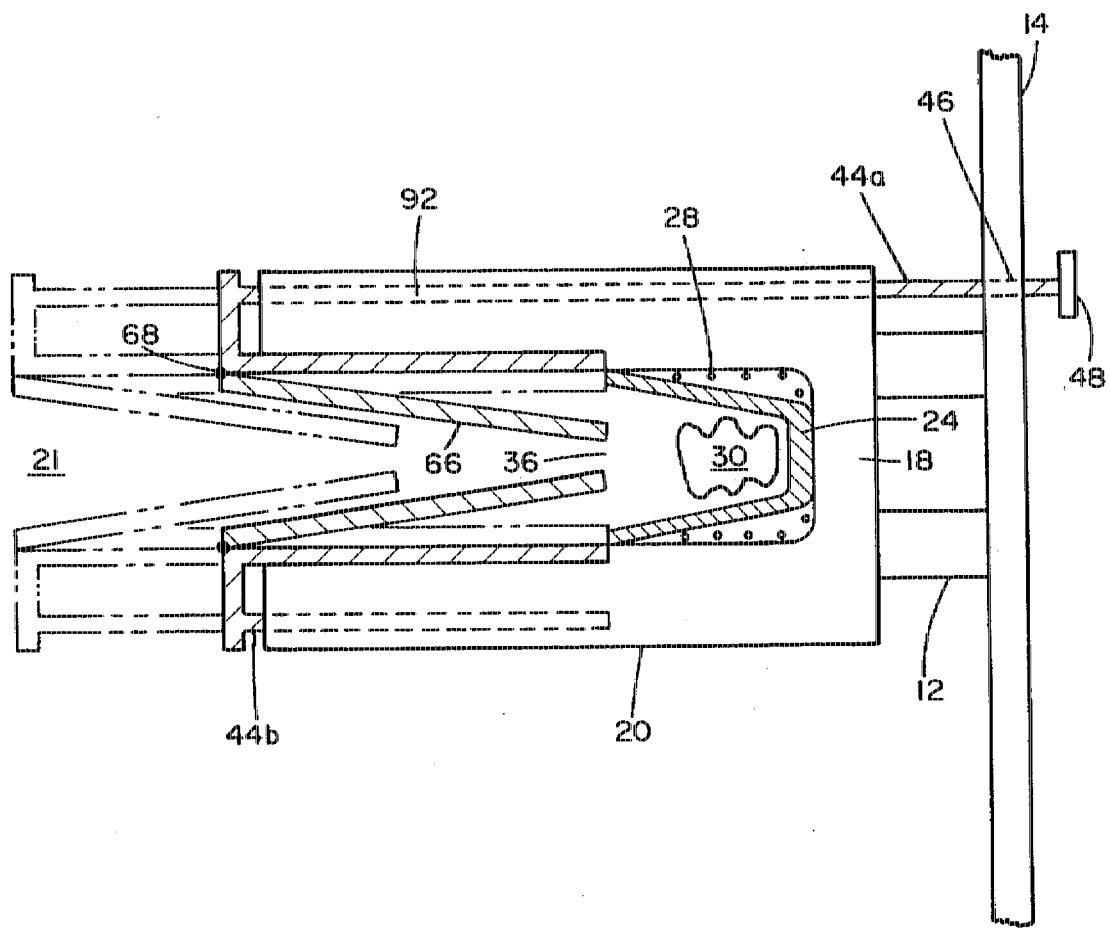
FIG. 5 is a cross-sectional view illustrating another embodiment of the present invention which combines the elements of the invention shown in FIGS. 1 and 3.

Referring now to FIG. 5, an aspect of the present invention which includes a variable area orifice which also travels with respect to the source is illustrated in a cross-sectional view. The device shown herein is a combination of the devices illustrated in FIGS. 1 and 3, therein enabling an operator to vary the flux of a molecular beam by reducing the angular distribution of the effusing source material which forms the beam by either repositioning the orifice and/or widening or narrowing it.

In each aspect of the present invention, a source material is heated to produce a molecular field having a density defined by the vapor pressure. By providing for the adjustment of an orifice size and/or the position of the orifice within the molecular field, the present invention permits a selected angular distribution of the molecular field to be isolated, the isolated distribution therein forming a molecular beam. The rapid and controllable variation in orifice size and/or position therein adjusting the flux of the molecular beam.

While there has been described and illustrated apparati and methods for varying the flux of a molecular beam produced by a molecular beam epitaxy cell, it will be apparent to those skilled in the art that variations and modifications are possible without deviating from the broad spirit and principle of the present invention which shall be limited solely by the scope of the claims appended hereto.

What is claimed is:

1. A molecular beam epitaxy source cell having a rapidly and controllably varying flux, comprising:

a crucible element including a sealed base, side walls, and an opening, having a quantity of source material disposed therein;

at least one heating element for raising the vapor pressure of the source material, thereby causing effusion of the source material;

a translatable conical section defining an orifice, interposed between the source material and said opening of the cell, slideably mounted within the crucible element; and means for selectively translating the conical section with respect to the effusing source material, whereby translation of the traveling orifice alters the angular distribution of effusing material which emanates from the cell, thereby controllably varying the flux emanating from the cell.

2. The molecular beam epitaxy cell according to claim 2, wherein said crucible element comprises pyrolytic boron nitride.

3. The molecular beam epitaxy cell according to claim 1, wherein said conical section comprises pyrolytic boron nitride.

4. A molecular beam epitaxy source cell having a rapidly and controllably varying flux, comprising:

a crucible element including a sealed base, side walls, and an opening, having a quantity of source material disposed therein;

at least one heating element for raising the vapor pressure of the source material, thereby causing effusion of the source material; and a conical section forming an orifice, fixedly mounted within the crucible element, interposed between the effusing source material and the opening, which orifice is selectively widenable, wherein widening of the orifice alters the angular distribution of effusing source material which emanates from the cell, therein varying the flux of the beam.

5. The molecular beam epitaxy source cell of claim 4, wherein the selectively widenable conical section comprises: a plurality of interleaving curvilinear members having (a) first ends, remote from the effusing source material, which are fixedly hinged to an inner surface of said side walls of the crucible, and (b) second ends, disposed nearer to the source material, which ends form a variable area orifice; the cross-sectional area of said conical section being enlarged or reduced by appropriate rotation of the interleaving members about said hinges.

6. A molecular beam epitaxy source cell having a rapidly and controllably varying flux, comprising:

a crucible element including a sealed base, side walls, and an opening, having a quantity of source material disposed therein;

at least one heating element for raising the vapor pressure of the source material, thereby causing effusion of the source material;

a translatable conical section forming an orifice, interposed between the source material and said opening of said cell, slideably mounted within the crucible element; and means for selectively translating the conical section with respect to the source material, said conical section further comprising a selective widenable orifice, whereby widening and/or translating the orifice adjusts the angular distribution of effusing material which emanates from the cell, thereby vary the flux of the beam.

7. A method of producing a molecular beam having a varying flux, comprising;

heating a source material within a crucible, having an open top, therein causing the source material to effuse to produce a molecular field from which a beam may be isolated;

selectively altering the angular distribution of said effusing molecular field which comprises the molecular beam, thereby varying the flux of the beam.

8. The method according to claim 7, wherein the step of selectively altering the angular distribution of the molecular field comprising the molecular beam comprises, translating a fixed area orifice with respect to the effusing source material.

9. The method according to claim 7, wherein the step of selectively altering the angular distribution of the molecular field comprising the molecular beam comprises, selectively adjusting the area of an orifice defined by an element mounted within said crucible which element is fixedly mounted with respect to the effusing source material.

* * * * *